(12) United States Patent
Izumi et al.

(10) Patent No.: US 7,936,122 B2
(45) Date of Patent: May 3, 2011

(54) ORGANIC EL DISPLAY APPARATUS

(75) Inventors: Nozomu Izumi, Kawasaki (JP); Daisuke Yoshitoku, Kawasaki (JP)

(73) Assignee: Canon Kabushiki Kaisha, Tokyo (JP)

(*) Notice: Subject to any disclaimer, the term of this patent is extended or adjusted under 35 U.S.C. 154(b) by 246 days.

(21) Appl. No.: 12/326,695

(22) Filed: Dec. 2, 2008

(65) Prior Publication Data

US 2009/0153042 A1 Jun. 18, 2009

(30) Foreign Application Priority Data

Dec. 14, 2007 (JP) ................................. 2007-323676
Oct. 15, 2008 (JP) ................................. 2008-266528

(51) Int. Cl.
*H05B 33/00* (2006.01)
(52) U.S. Cl. .......................... 313/504; 313/506; 313/512
(58) Field of Classification Search .................. None
See application file for complete search history.

(56) References Cited

U.S. PATENT DOCUMENTS

| | | | | |
|---|---|---|---|---|
| 7,329,987 | B2 * | 2/2008 | Shitagami et al. | 313/512 |
| 7,576,482 | B2 | 8/2009 | Oh | 313/500 |
| 2005/0023964 | A1 | 2/2005 | Omura et al. | 313/504 |
| 2005/0110020 | A1 | 5/2005 | Hayashi et al. | 257/72 |
| 2005/0218796 | A1 | 10/2005 | Kubota | 313/506 |
| 2006/0125390 | A1 * | 6/2006 | Oh | 313/506 |
| 2006/0197445 | A1 | 9/2006 | Watanabe | 313/512 |
| 2006/0202615 | A1 * | 9/2006 | Murakami et al. | 313/506 |
| 2006/0220016 | A1 | 10/2006 | Lee et al. | 257/59 |
| 2007/0024181 | A1 | 2/2007 | Oh | 313/500 |
| 2007/0170859 | A1 * | 7/2007 | Choi et al. | 313/512 |

FOREIGN PATENT DOCUMENTS

| | | |
|---|---|---|
| JP | 2003-271075 | 9/2003 |
| JP | 2003-282240 | 10/2003 |
| JP | 2004-335267 | 11/2004 |
| JP | 2005-164818 | 6/2005 |
| JP | 2005-251721 | 9/2005 |
| JP | 2005-302707 | 10/2005 |
| JP | 2006-244933 | 9/2006 |
| JP | 2006-269405 | 10/2006 |
| JP | 2007-041561 | 2/2007 |

* cited by examiner

*Primary Examiner* — Ashok Patel
(74) *Attorney, Agent, or Firm* — Fitzpatrick, Cella, Harper & Scinto

(57) ABSTRACT

An organic EL display apparatus is sealed with a protective film composed of a resin protective film and an inorganic protective film. In the organic EL display apparatus, a planarizing film has a dividing region which divides the planarizing film into a region where organic EL elements are arranged and a peripheral region thereof. An end of the resin protective film is located in the dividing region or in the region where the organic EL elements are arranged, away from the planarizing film in the peripheral region. The inorganic protective film covers the end of the resin protective film and further extends to the dividing region.

8 Claims, 4 Drawing Sheets

REFERENCE EXAMPLE
PRIOR ART

ORGANIC EL DISPLAY APPARATUS

BACKGROUND OF THE INVENTION

1. Field of the Invention

The present invention relates to a display apparatus including organic electroluminescent (hereinafter referred to as "organic EL") elements, and more particularly relates to a sealing structure.

2. Description of the Related Art

In recent years, organic EL display apparatuses which are self-luminous have been receiving attention as flat panel displays. In an area (display area) where an image is displayed in an organic EL display apparatus, a plurality of organic EL display elements, each having an organic layer sandwiched between first and second electrodes, are arranged, and the organic EL elements serve as pixels and emit light to display an image. The organic EL elements are highly susceptible to moisture and oxygen. When moisture or oxygen infiltrates into organic EL elements from the outside, the organic EL elements may degrade, resulting in generation of non-light-emitting portions referred to as dark spots.

As a structure for preventing moisture and oxygen from infiltrating into organic EL elements from the outside, Japanese Patent Laid-Open No. 2003-282240 (Patent Document 1) discloses a structure in which a protective film composed of a resin protective film 109 and an inorganic protective film 110 covers organic EL elements, as shown in FIG. 6. According to Patent Document 1, the resin protective film 109 covers the organic EL elements and a surface of the substrate around the organic EL elements, and the inorganic protective film 110 covers the resin protective film 109, an edge thereof, and a surface of the substrate around the resin protective film 109. In such a structure, since the resin protective film 109 which can be an infiltration path of moisture is not exposed to the outside, infiltration of moisture can be prevented, and the organic EL elements can be prevented from being degraded.

Furthermore, in a top-emission-type organic EL display apparatus, a planarizing film 104 composed of a resin material is provided in order to planarize irregularities of pixel circuits 102 disposed between the substrate and the organic EL elements so that layers to be stacked can be prevented from being disconnected (refer to FIG. 7). Since the planarizing film 104 also has the function of protecting the pixel circuits 102 and peripheral circuits 103, the planarizing film 104 is also formed on the peripheral circuits 103 continuously from the display area. When a glass substrate 701 and an organic EL display apparatus having such a structure are sealed with an adhesive 702, moisture may infiltrate from the outside through the planarizing film 104 into the display area, resulting in degradation of the organic EL elements.

In order to solve such a problem, Japanese Patent Laid-Open No. 2005-164818 (Patent Document 2) discloses a technique in which a region B which divides the planarizing film 104 is disposed around the periphery of the display area so as to prevent infiltration of moisture, as shown in FIG. 7.

The structure in which, in order to prevent moisture from infiltrating into organic EL elements, a resin protective film and an inorganic protective film are disposed to protect the organic EL elements is suitable for mass production because production cost and the number of steps can be reduced. However, when such protective films are used in a top-emission-type organic EL display apparatus having a planarizing film disposed substantially over the entire surface of the substrate, in the structure according to Patent Document 1, moisture infiltrates from the outside through the planarizing film into the organic EL elements.

Even in the case where a dividing region is provided in the planarizing film as in Patent Document 2, if an end of the resin protective film 109 is located on the planarizing film 104 outside the dividing region B as shown in FIG. 8, moisture entering from the planarizing film 104 infiltrates through the resin protective film 109 into the display area.

Therefore, in the structure described above, it is very difficult to obtain sufficient reliability in the luminous characteristics of the organic EL elements.

SUMMARY OF THE INVENTION

The present invention provides an organic EL display apparatus including a substrate, a driving circuit disposed on the substrate, a planarizing film composed of a resin material and covering the driving circuit, a plurality of organic EL elements arranged on the planarizing film, each of the organic EL elements including an organic compound layer sandwiched between a first electrode and a second electrode, a resin protective film covering at least the plurality of organic EL elements, and an inorganic protective film covering at least the resin protective film. The planarizing film has a dividing region which divides the planarizing film into a region where the organic EL elements are arranged and a peripheral region thereof. An end of the resin protective film is located in the dividing region or in the region where the organic EL elements are arranged, away from the planarizing film in the peripheral region, and the inorganic protective film covers the end of the resin protective film and further extends to the dividing region.

According to the organic EL display apparatus of the present invention, since the end of the resin protective film is located in the dividing region of the planarizing film or in the region where the organic EL elements are arranged, away from the planarizing film in the peripheral region, it is possible to isolate the resin material that can be an infiltration path of moisture. As a result, moisture can be prevented from infiltrating from the outside through the planarizing film and the resin protective film into the display area, and thus it is possible to produce a highly reliable organic EL display apparatus in which degradation of the organic EL elements due to moisture is reduced.

Further features of the present invention will become apparent from the following description of exemplary embodiments with reference to the attached drawings.

DESCRIPTION OF THE EMBODIMENTS

Figure 1A:
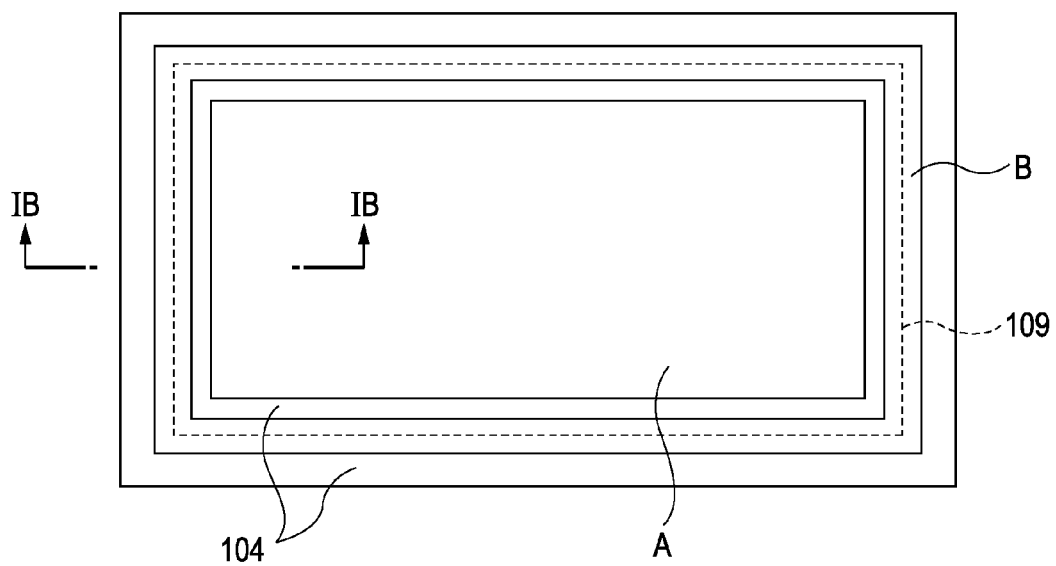
FIG. 1A is a plan view of an organic EL display apparatus according to an embodiment and Example 1 of the present invention.
Figure 1B:
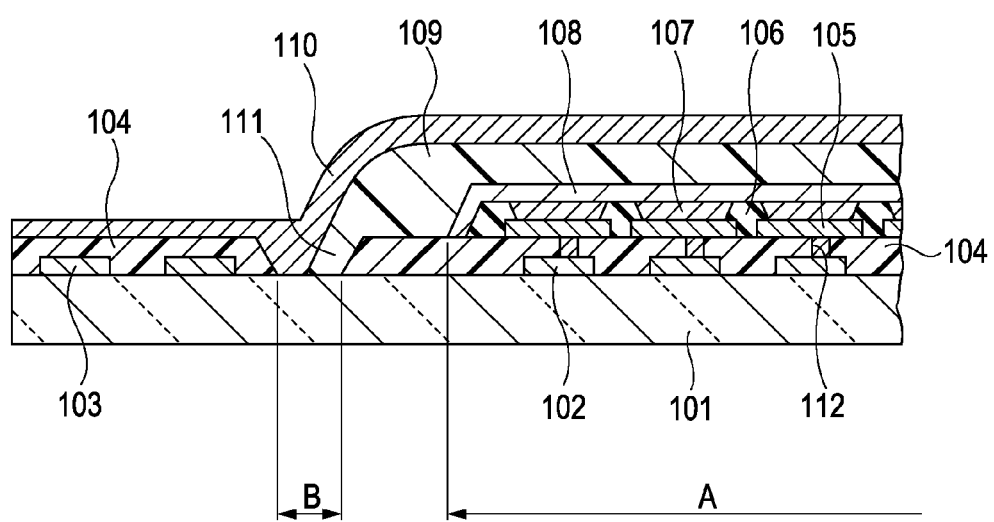
FIG. 1B is a cross-sectional view taken along the line IB-IB of FIG. 1A.

An embodiment of the present invention will be described component by component with reference to FIGS. 1A and 1B, and then a production method therefor will be described. FIG. 1A is a plan view of an organic EL display apparatus according to the embodiment of the present invention, and FIG. 1B is a cross-sectional view taken along the line IB-IB of FIG. 1A. The organic EL display apparatus has a display area A.

(Substrate)

As a substrate, an insulating substrate 101 composed of glass or the like is used, on which driving circuits are disposed. The term "driving circuits" means both or either of pixel circuits 102 for driving organic EL elements and peripheral circuits 103 for driving the pixel circuits 102. When the pixel circuits 102 and the peripheral circuits 103 are disposed on the substrate 101, both circuits are electrically connected to each other via lines (not shown). As the driving circuits 102, active matrix circuits having TFTs composed of polycrystalline silicon (hereinafter referred to as "p-Si"), amorphous silicon (hereinafter referred to as "a-Si"), or the like can be suitably used.

(Planarizing Film)

As employed herein, the phrase "planarizing film" includes a film which covers surface irregularities on underlying film(s) to provide a uniform, flat, interfacial surface on which additional layer(s) can be laminated, such that delamination or peeling of such additional layer(s) is inhibited. A planarizing film 104 composed of a resin material, such as an acrylic resin or a polyimide resin, is disposed on the surface of the driving circuits. In the display area A, the planarizing film 104 plays a role of planarizing irregularities on the surface of the substrate mainly due to the pixel circuits 102 so that layers to be stacked can be prevented from being disconnected. Outside the display area A, the planarizing film 104 plays a role of protecting the peripheral circuits 103 from the process of etching of electrodes, etc.

A dividing region B which divides the planarizing film 104 is disposed in a region in the periphery of the display area A and not provided with the driving circuits. Thus, the planarizing film 104 is divided by the dividing region B into a region where the organic EL elements are arranged, i.e., a region including the display area, and a peripheral region thereof. The dividing region B prevents moisture from infiltrating from the outside through the planarizing film 104 into the display area A, thereby preventing degradation of organic EL elements. Hereinafter, for simplification of explanation, the planarizing film in the region where the organic EL elements are arranged is referred to as the planarizing film in the display area (or the display area planarizing film).

For example, the dividing region B may be provided between the pixel circuits 102 and the peripheral circuits 103. The pixel circuits 102 and some of the peripheral circuits 103 may be covered with the planarizing film in the display area, and the remaining peripheral circuits 103 may be covered with the planarizing film in the peripheral region (or the peripheral area planarizing film).

When the peripheral circuits are disposed around part of the periphery of the display area, not around the whole periphery of the display area, it is not necessary to dispose the planarizing film in the peripheral region around the whole periphery of the display area, but the planarizing film may be disposed only in the part where the peripheral circuits are disposed. In other words, when the peripheral area planarizing film is disposed around part of the periphery of the display area, the dividing region is also disposed around part of the periphery of the display area.

In the planarizing film 104 in the display area, a contact hole 112 for electrically connecting a first electrode 105, which will be described below, and the pixel circuit 102 is provided for each pixel circuit.

(First Electrode)

The first electrode 105 connected to the pixel circuit 102 through the contact hole 112 is formed on the planarizing film for each organic EL element. For the first electrode 105, a known material for electrodes of organic EL elements, such as Al, Ag, Au, ITO, IZO, or ZnO, can be used.

According to need, an element isolation film 106 may be provided between the organic EL elements. The element isolation film 106 prevents an organic compound layer, which is to be a deposited layer, from being disconnected by stepped portions due to the thickness of the first electrode, and also defines a light-emitting region of the organic EL element. An insulating material is suitably used as a material for the element isolation film 106. Specifically, a resin material, such as an acrylic resin or a polyimide resin, is suitably used.

(Organic Compound Layer)

An organic compound layer 107 including a luminescent layer is disposed on the first electrode 105. The organic compound layer 107 may include, in addition to the luminescent layer, other functional layers, such as a hole injection layer, a hole transport layer, an electron transport layer, and an electron injection layer. For the individual layers in the organic compound layer 107, known materials can be used.

(Second Electrode)

A second electrode 108 is disposed on the organic compound layer 107, and thereby, each organic EL element includes the organic compound layer 107 sandwiched between a pair of electrodes. The same material for the first electrode 105 may be used for the second electrode 108. In order to extract light generated in the organic EL element, at least one of the first electrode 105 and the second electrode 108 is required to be transparent. As the electrode disposed on the light extraction side, a transparent electroconductive film, a semi-transmissive electroconductive film composed of a metal thin film, or a film in which these are laminated, may be used.

(Protective Film)

A protective film composed of a resin protective film 109 and an inorganic protective film 110 is disposed over the second electrode 108.

The organic EL display apparatus is produced by undergoing a plurality of pattern formation steps using conventional photolithography, etc. and vacuum film deposition steps. Because of etching residues generated in these steps and adherence of films separated from the inner wall of the vacuum apparatus, irregularities are generated on the surface of the display area in which the organic EL elements are arranged. The height of irregularities depends on the production method, the vacuum apparatus, etc., and is, in many cases, 5 μm or less. If such a surface of the display area is protected only by an inorganic protective film, when the thickness of the inorganic protective film is small, the irregularities are not completely covered, and defects occur in the inorganic protective film, resulting in moisture infiltration. If an inorganic protective film having a thickness larger than the height of irregularities is formed in order to sufficiently cover the irregularities, membrane stress increases, and cracks easily occur, resulting in an increase in the time required for forming the inorganic protective film and cost in the production.

In the present invention, before the inorganic protective film is formed, at least the surface of the organic EL elements is covered with the resin protective film 109 to planarize the irregularities on the surface by forming a uniform interfacial surface on such irregularities. The resin protective film 109 is formed with a thickness equal to or larger than the height of the irregularities generated in the production steps. In view of the height of irregularities due to the usual production steps and production cost, the thickness of the resin protective film 109 can be typically 5 to 30 μm.

The end 111 of the resin protective film 109 is located in the dividing region B of the planarizing film 104 or in the region where the organic EL elements are arranged, away from the planarizing film in the peripheral region. If the end 111 of the resin protective film 109 corresponds to the outer periphery of the dividing region B or is located outside the dividing region B, moisture entering from the outside through the planarizing film 104 bypasses the inorganic protective film 110 and infiltrates into the display area A through the resin protective film 109, resulting in degradation of the organic EL elements.

Furthermore, when the planarizing film in the peripheral region is disposed around only part of the periphery of the planarizing film in the display area, the resin protective film must be controlled so as not to spread to the end of the substrate in the part where the planarizing film in the peripheral region is not provided. The reason for this is that the surface of the resin protective film is securely covered with the inorganic protective film, and moisture is prevented from infiltrating through the resin protective film.

Since the surface of the resin protective film 109 is desirably smooth without large irregularities, a material that can be applied in a liquid form onto the substrate and then can be cured to form a solid is suitably used. Specific examples of the material include polyolefin-based resin, a polyether resin, an epoxy resin, an acrylic resin, and a silicone resin.

Next, at least the surface of the resin protective film 109 is covered with the inorganic protective film 110 so as to prevent moisture from infiltrating into the organic EL elements. The surface of the resin protective film 109 is smooth and flat, and thus can be covered by the inorganic protective film 110 at a thickness of about 0.5 to 3 μm to prevent the infiltration of moisture. For the inorganic protective film 110, a material having low moisture permeability, such as silicon nitride, silicon oxide, or a mixture thereof, may be used.

Figure 4:
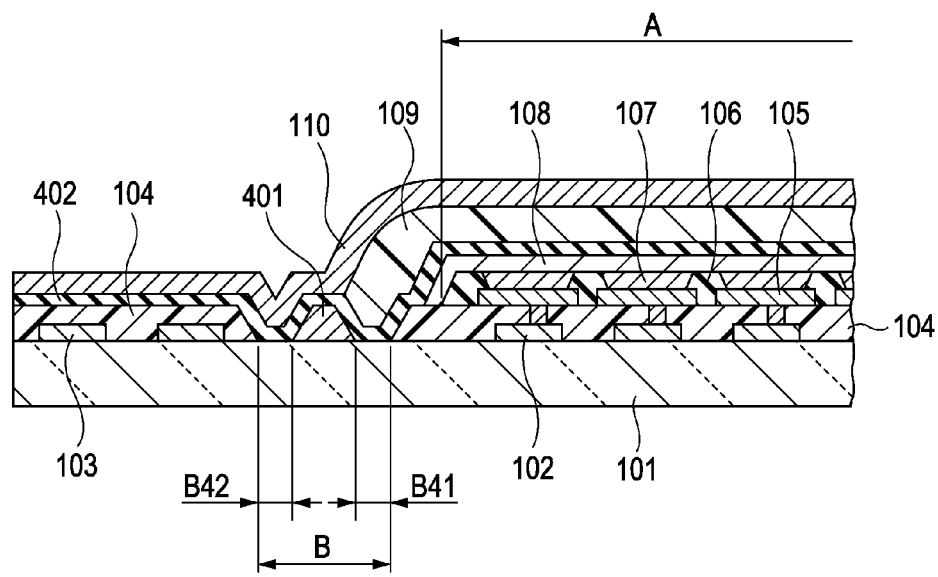
FIG. 4 is a cross-sectional view of an organic EL display apparatus according to Example 4 of the present invention.

As shown in FIG. 4, an inorganic base film 402 composed of a material having high mechanical strength may be disposed on the second electrode 108 in the display area before the resin protective film 109 is formed. When the inorganic base film 402 is disposed, it is possible to prevent cure shrinkage during curing of the material for the resin protective film 109 and membrane stress after curing from being transmitted to the layers stacked in the display area, and film separation can be prevented. Furthermore, in comparison with the case where the inorganic base film 402 is not provided, the permissible ranges of cure shrinkage and membrane stress of the material for the resin protective film can be increased, and the number of choices for the resin material usable for the resin protective film can be increased.

As the material for the inorganic base film 402, aluminum oxide, silicon nitride, silicon oxide, or the like can be used. Since the inorganic base film 402 does not require the function of blocking moisture, the thickness of the inorganic base film 402 can be 0.1 to 1 μm.

(Production Method)

A method for producing an organic EL display apparatus according to the embodiment of the present invention will be described below.

TFTs and driving circuits can be formed on an insulating substrate composed of glass or the like by a common method.

A photosensitive acrylic resin is applied by a spin coater onto the entire surface of the substrate provided with the driving circuits in air, followed by heat curing, thereby to obtain a planarizing film 104. Subsequently, by removing the planarizing film 104 in the periphery of the display area A using photolithography, a dividing region B is formed. Simultaneously, a contact hole 112 is formed for each pixel circuit 102.

First electrodes 105 are formed by sputtering. For example, a laminated film of Al and ITO is formed, and the laminated film is formed into a pattern corresponding to the organic EL elements by photolithography. The first electrodes 105 are electrically connected to the corresponding pixel circuits 102 via the contact holes 112 formed in the planarizing film 104.

An element isolation film 106 is formed by a spin coater entirely on the substrate, as in the planarizing film 104, and then patterning is performed by photolithography. After patterning, annealing is performed to a sufficient extent to reduce moisture content in the planarizing film and the element isolation film. By sufficiently removing moisture contained in the planarizing film 104 and the element isolation film 106, moisture can be prevented from infiltrating from those layers into the organic EL elements which are formed later.

An organic compound layer 107 can be formed using conventional materials by vapor deposition, a laser transfer method, an ink jet coating method, or the like. When the organic compound layer 107 is formed by vapor deposition with a different thickness or using a different material for each organic EL element, a metal mask may be used. After the organic compound layer 107 is formed, until the formation of an inorganic protective film 110, production steps are carried out in an atmosphere in which the dew point is controlled so that moisture is prevented from infiltrating into the organic EL elements during the steps.

A resin protective film 109 is formed such that the end 111 of the resin protective film 109 is located away from and on the display area side of the outer periphery of the dividing region B of the planarizing film 104. In order to locate the end of the resin protective film 109 at a predetermined position, a method may be employed in which a dispenser capable of drawing patterns, screen printing, or the like is used and the dividing region B is formed in advance with a width larger than the minimum coating width achieved by the coating device. As the width of the dividing region B increases, the frame of the resulting organic EL display apparatus increases. Therefore, desirably, a coating device with high coating precision is used, and the width of the dividing region B is set at 20 to 200 μm.

As another method of positioning the end 111 of the resin protective film 109, an end positioning structure which positions the end of the resin protective film may be provided. The end positioning structure can resist spreading of the applied material for the resin protective film along the coating surface and stop the spreading at a predetermined position. The end positioning structure can be formed in the outer periphery of a region where the resin protective film 109 is to be formed using a trench, a bank, or a combination thereof as illustrated by 201 of FIG. 2, B31 of FIG. 3 and B41 of FIG. 4. By employing the end positioning structure, a resin material having such a low viscosity that the spreading end position of which cannot be set, after coating, by drawing with a dispenser or printing alone can be used. Depending on the viscosity of the resin protective film material, a plurality of end positioning structures may be used.

In order to position the end of the resin protective film in a part where no dividing region is provided, an end positioning structure similar to that for the dividing region can be used.

The end positioning structure can be formed without an additional step or material if any one of materials constituting the organic EL display apparatus, such as the material for the planarizing film or the element isolation film, is used and the end positioning structure is formed simultaneously in the step of patterning such a film.

When the end positioning structure is formed using a resin material, it is necessary to cover the surface of the end positioning structure as well as the surface of the resin protective film with the inorganic protective film so that moisture is prevented from entering from the outside.

The applied material for the resin protective film is cured by heating or UV irradiation.

The inorganic protective film 110 and the inorganic base film 401 shown in FIG. 4 can be formed using a vacuum film deposition method, such as plasma CVD or sputtering.

EXAMPLES

Examples of the present invention will be described in detail below.

Example 1

FIG. 1A is a plan view of an organic EL display apparatus according to Example 1, and FIG. 1B is a cross-sectional view taken along the line IB-IB of FIG. 1A.

First, driving circuits having TFTs composed of p-Si were formed on a glass substrate with dimensions of 100 mm in length, 100 mm in width, and 0.5 mm in thickness. A plurality of pixel circuits 102 were formed in the display area A, and peripheral circuits 102 for driving the pixel circuits 102 were formed in the peripheral region so as to surround the display area A. Next, an ultraviolet-curable acrylic resin of the photoresist type as a material for a planarizing film was applied by a spin coater onto the driving circuits, a photomask having patterns of contact holes 112 and a driving region B was placed thereon, and exposure was performed with an illuminance of 1,800 mW. Development was performed using a developer, followed by post-baking at 200° C. Thereby, a planarizing film 104 with a thickness of 2 μm having the contact holes 112 and the dividing region B was obtained. The dividing region B was formed by removing the planarizing film at a portion extending from the position at a distance of 350 μm from the outer periphery of the display area A with a width of 200 μm. Thereby, the planarizing film was divided into the planarizing film in the display area and the planarizing film in the peripheral region.

Next, an IZO layer with a thickness of 50 nm was deposited by sputtering on an Al layer with a thickness of 100 nm to form a first electrode layer. After the first electrode layer was formed over the entire surface of the laminate on the substrate, patterning was performed by photolithography to form first electrodes 105 at positions corresponding to the pixel circuits 102. The first electrodes 105 were electrically connected to the corresponding pixel circuits 102 via the contact holes 112.

A polyimide resin was applied by a spin coater at a thickness of 1.6 μm over the planarizing film 104 and the first electrodes 105, and then the polyimide resin formed in the light-emitting regions of the individual pixels and a region outside the display area A was removed by photolithography, to thereby obtain an element isolation film 106.

The substrate provided with the element isolation film 106, etc. was heated for 10 minutes in an atmosphere with a pressure of $10^{-2}$ Pa and at 150° C., and then an organic compound layer 107 was formed on each first electrode 105 in the display area A. As the organic compound layer 107, a hole transport layer, a luminescent layer, an electron transport layer, and an electron injection layer composed of known organic materials were deposited in that order by a resistance heating vapor deposition method.

Subsequently, a second electrode 108 composed of IZO was formed at a thickness of 50 nm by sputtering over the entire surface of a region away from and on the display area side of the outer periphery of the dividing region B.

Next, in a nitrogen atmosphere at a dew-point temperature of −60° C., a thermosetting epoxy resin with a viscosity of 3,000 mPa·s was applied so as to cover the organic EL elements using a dispenser capable of drawing patterns with precision (SHOT MINI SL manufactured by Musashi Engineering, Inc). When the application was performed such that the periphery of the locus drawn by the dispenser nozzle traced the centerline in the width direction of the dividing region B, it was possible to locate the end of the applied epoxy resin within the dividing region of the planarizing film with a width of 200 μm, away from the planarizing film in the peripheral region. The applied epoxy resin was cured by heating at 100° C. for 15 minutes in a vacuum environment, and thereby, a resin protective film 109 with a thickness of 30 μm was formed.

Furthermore, an inorganic protective film 110 composed of silicon nitride was formed by plasma CVD using $SiH_4$ gas, $N_2$ gas, and $H_2$ gas. The inorganic protective film was formed with a thickness of 1 μm so as to cover the entire surface of the substrate provided with the organic EL elements.

The resulting organic EL display apparatus was subjected to a storage test at a temperature of 60° C. and humidity of 90%. According to the storage test results (even after 1,000 hours), no dark spots were observed.

Example 2

Figure 2:
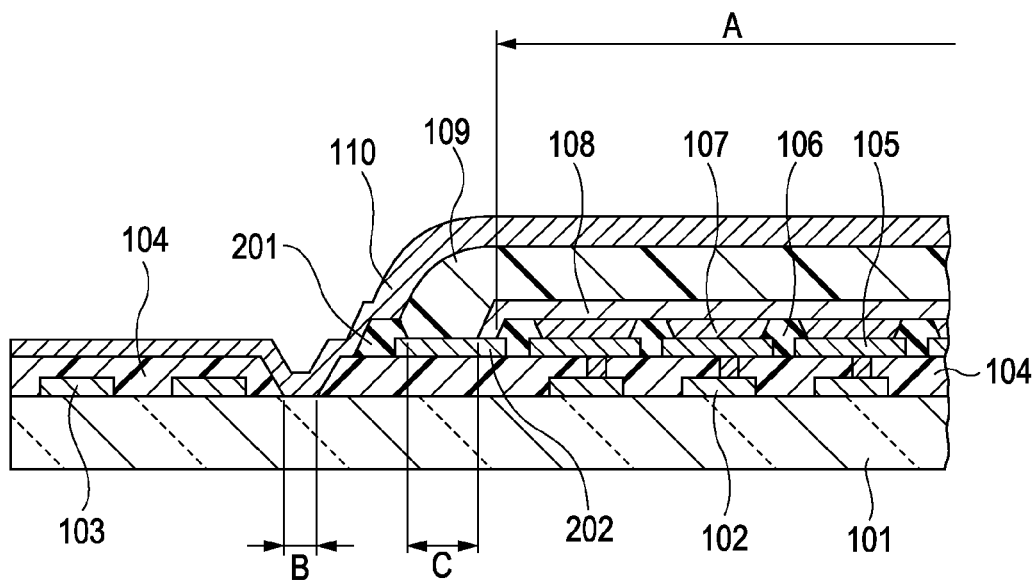
FIG. 2 is a cross-sectional view of an organic EL display apparatus according to Example 2 of the present invention.

FIG. 2 is a cross-sectional view of an organic EL display apparatus according to Example 2.

Example 2 differs from Example 1 in that the end of the resin protective film 109 was located in a region of the planarizing film where the organic EL elements were arranged, an end positioning structure 201 for positioning the end of the resin protective film was formed, the end positioning structure 201 being composed of the material for the element isolation film, and a material having low viscosity was used for the resin protective film. The components represented by the same reference numerals as those in FIGS. 1A and 1B were formed as in Example 1.

The end positioning structure 201 for positioning the end of the resin protective film was formed by a method in which, in the process of patterning the element isolation film 106, the material for the element isolation film was left, with a width of 50 μm, between the display area A and the inner periphery of the dividing region B so as to surround the display area A. The first electrode material was left in a region C where the element isolation film 106 outside the display area A was to be removed. The first electrode material in the region C functioned as an etching stop film 202 for preventing the planarizing film 104 from being overetched when the material for the element isolation film was subjected to patterning.

As the material for the resin protective film, a thermosetting epoxy resin with a viscosity of 1,500 mPa·s was applied so as to cover a region extending to the position 1 mm away from the end positioning structure 201 for positioning the resin protective film, on the display area A side. The applied epoxy resin spread along the coated surface because of its low viscosity, but did not spread beyond the end positioning structure 201. It was possible to locate the end of the resin protective film inside the dividing region away from the planarizing film in the peripheral region. Furthermore, because of the lower viscosity, the thickness of the resin protective film was 20 µm, which was smaller than Example 1.

The resulting organic EL display apparatus was subjected to a storage test at a temperature of 60° C. and humidity of 90%. According to the storage test results (even after 1,000 hours), no dark spots were observed.

Example 3

Figure 3:
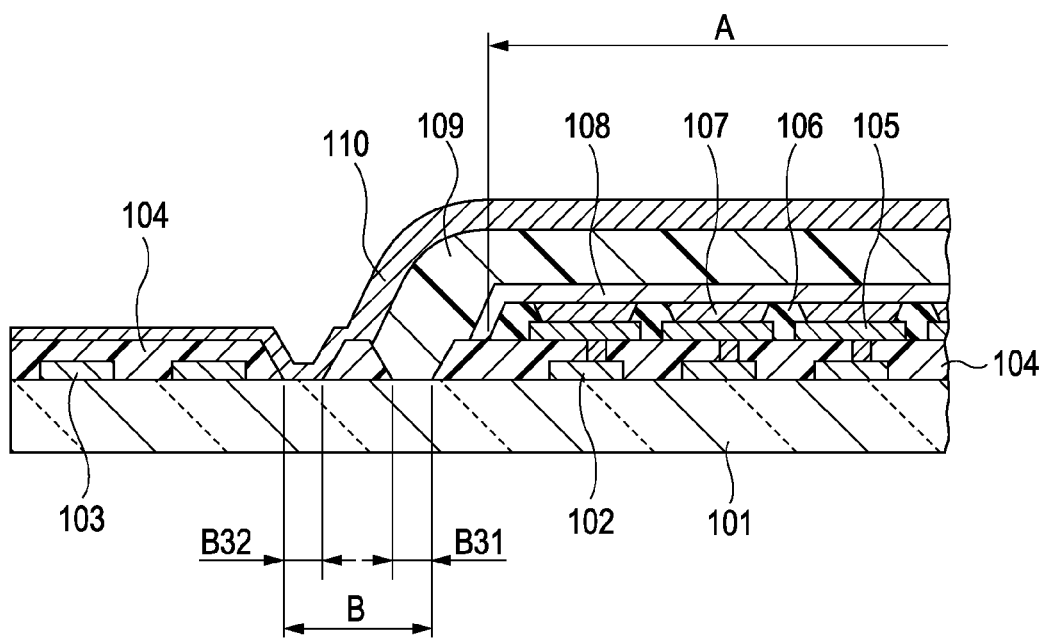
FIG. 3 is a cross-sectional view of an organic EL display apparatus according to Example 3 of the present invention.

FIG. 3 is a cross-sectional view of an organic EL display apparatus according to Example 3.

Example 3 differs from Example 2 in that two dividing regions of the planarizing film were formed, and a dividing region B31 on the display area side was used as the end positioning structure for the resin protective film. The components represented by the same reference numerals as those in FIG. 2 were formed as in Example 2.

The two dividing regions B31 and B32 of the planarizing film were formed at an interval of 70 µm, each with a width of 100 µm. The applied material for the resin protective film stopped at the dividing region B31 located on the display area side and did not spread to the dividing region B32. It was possible to locate the end of the resin protective film inside the dividing region away from the planarizing film in the peripheral region.

The resulting organic EL display apparatus was subjected to a storage test at a temperature of 60° C. and humidity of 90%. According to the storage test results (even after 1,000 hours), no dark spots were observed.

Example 4

FIG. 4 is a cross-sectional view of an organic EL display apparatus according to Example 4.

Example 4 differs from Example 3 in that a divider 401 was formed using the material for the element isolation film so as to divide the dividing region of the planarizing film in the width direction, a dividing region B41 on the display area side was used as the end positioning structure for the resin protective film, and an inorganic base film 402 was formed in the display area.

By forming the inorganic base film 402, it is possible to prevent shrinkage shear force during curing of the material of the resin protective film 109 and membrane stress after curing from being transmitted to the layers stacked under the inorganic base film 402, and film separation can be prevented. The components represented by the same reference numerals as those in FIGS. 1A and 1B were formed as in Example 2.

The divider 401 was formed using the material for the element isolation film with a thickness of 50 µm so as to surround the display area A and to divide the dividing region B.

As the inorganic base film 402, a silicon nitride film was formed by plasma CVD using $SiH_4$ gas, $N_2$ gas, and $H_2$ gas, with a thickness of 0.2 µm, so as to cover the display area provided with the second electrode 108.

The resulting organic EL display apparatus was subjected to a storage test at a temperature of 60° C. and humidity of 90%. According to the storage test results (even after 1,000 hours), no dark spots were observed.

Example 5

Figure 5:
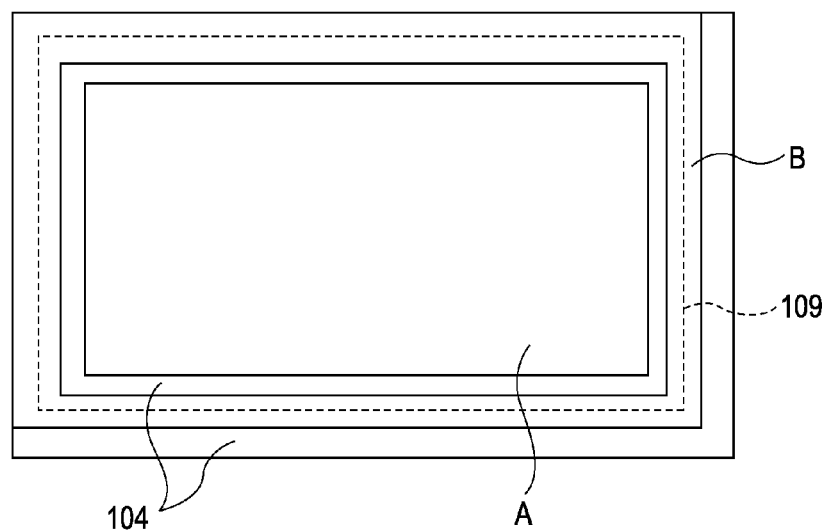
FIG. 5 is a plan view of an organic EL display apparatus according to Example 5 of the present invention.
Figure 6:
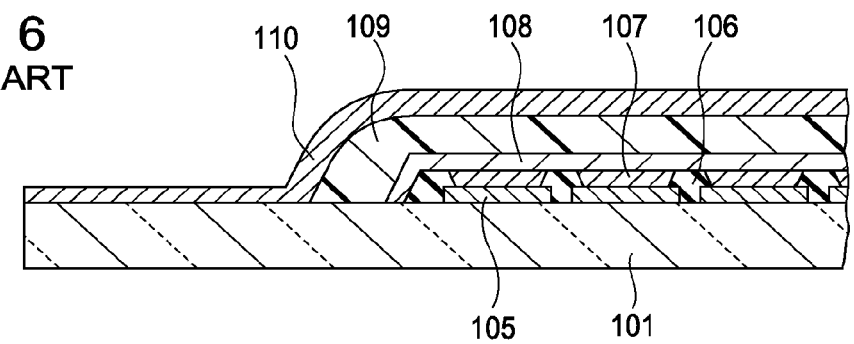
FIG. 6 is a cross-sectional view of a prior art organic EL display apparatus according to Patent Document 1.
Figure 7:
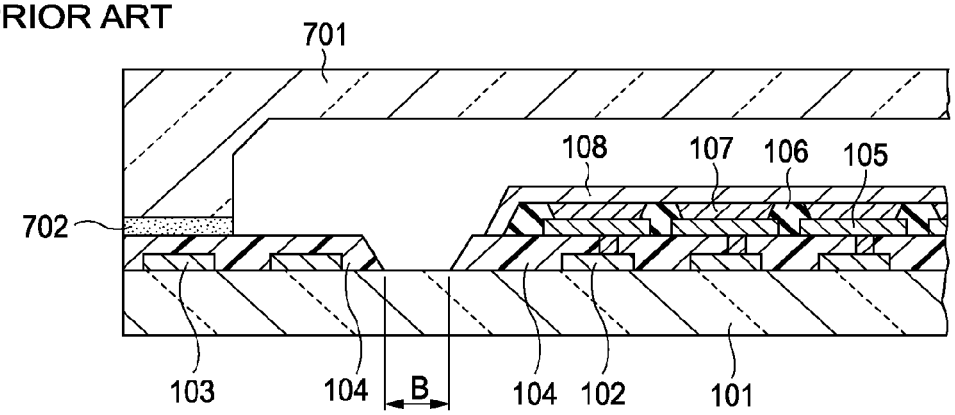
FIG. 7 is a cross-sectional view of a prior art organic EL display apparatus according to Patent Document 2.

FIG. 5 is a plan view of an organic EL display apparatus according to Example 5.

Example 5 differs from Example 1 in that peripheral circuits were disposed around part of the periphery of the display area A only. Consequently, the planarizing film 104 in the peripheral region was disposed around part of the periphery of the display area A. The components represented by the same reference numerals as those in FIGS. 1A and 1B were formed as in Example 1.

In the part where the planarizing film in the peripheral region was disposed, when the application was performed such that the periphery of the locus drawn by the dispenser nozzle traced the centerline in the width direction of the dividing region B, it was possible to locate the end of the resin protective film 109 within the dividing region B of the planarizing film with a width of 200 µm. In the part where the planarizing film in the peripheral region was not disposed, the material for the resin protective film was applied such that the dispenser nozzle drew a locus at the position 500 µm away from the end of the planarizing film in the display area. As a result, it was possible to locate the end of the resin protective film 109 at 500 µm inside from the end of the substrate (on the display area side).

The resulting organic EL display apparatus was subjected to a storage test at a temperature of 60° C. and humidity of 90%. According to the storage test results (even after 1,000 hours), no dark spots were observed.

Comparative Example 1

Figure 8:
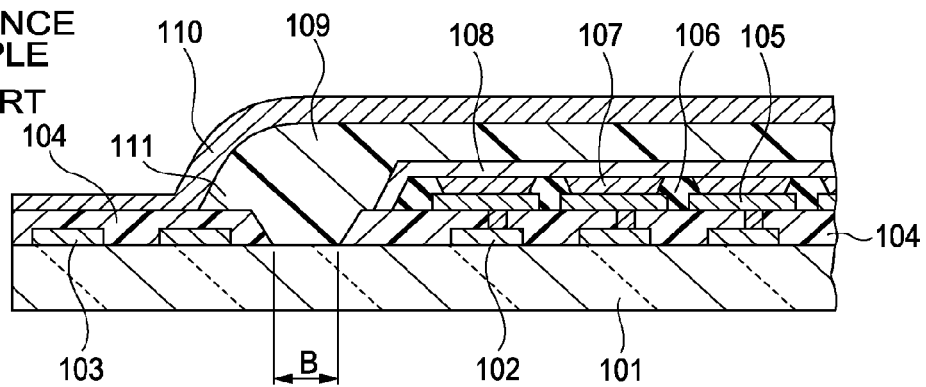
FIG. 8 is a cross-sectional view of a reference organic EL display apparatus according to Comparative Example 1.

An organic EL display apparatus was produced as in Example 1 except that the end 111 of the resin protective film 109 was located outside the dividing region B of the planarizing film as shown in FIG. 8. The resulting organic EL display apparatus was subjected to a storage test at a temperature of 60° C. and humidity of 90% for 1,000 hours. According to the storage test results, expansion of dark spots was observed in about 20 sites.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-323676 filed Dec. 14, 2007 and No. 2008-266528 filed Oct. 15, 2008, which are hereby incorporated by reference herein in their entirety.

What is claimed is:
1. An organic EL display apparatus comprising:
a substrate on which a plurality of pixel circuits and a peripheral circuit are disposed;
a planarizing film composed of a resin material and disposed on the pixel circuits and the peripheral circuit;
a plurality of organic EL elements arranged on the planarizing film, corresponding to the pixel circuit;
a resin protective film covering the plurality of organic EL elements; and
an inorganic protective film covering the resin protective film, wherein the planarizing film has a dividing region which divides the planarizing film into a region provided on the pixel circuits and a peripheral region provided on the peripheral circuit;

an end of the resin protective film is located in the dividing region, away from the planarizing film in the peripheral region; and the inorganic protective film is in contact with the substrate in the dividing region.

2. The organic EL display apparatus according to claim 1, wherein a position of the end of the resin protective film is determined by an end positioning structure comprising a bank, a trench or a combination thereof.

3. The organic EL display apparatus according to claim 2, wherein the end positioning structure which positions the end of the resin protective film is composed of the planarizing film.

4. The organic EL display apparatus according to claim 3, further comprising an element isolation film for dividing a light-emitting region of the plurality of organic EL elements, wherein the end positioning structure comprises a material for forming the element isolation film.

5. An organic EL display apparatus comprising:
a substrate on which a plurality of pixel circuits and a peripheral circuit are disposed;
a planarizing film composed of a resin material and disposed on the pixel circuits and the driving circuit;
a plurality of organic EL elements arranged on the planarizing film, corresponding to the pixel circuits;
an inorganic base film composed of an inorganic material covering at least the plurality of organic EL elements; and
a resin protective film which is disposed on the inorganic base film and covering at least the plurality of organic EL elements; and
an inorganic protective film covering the resin protective film,
wherein the planarizing film has a dividing region which divides the planarizing film into a region where the organic EL elements are arranged and a peripheral region thereof;
an end of the resin protective film is located in the dividing region, away from the planarizing film in the peripheral region; and
wherein, in the dividing region, the inorganic base film is in contact with the substrate, and in a portion where the inorganic base film is in contact with the substrate, the inorganic protective film is in contact with the inorganic base film.

6. The organic EL display apparatus according to claim 5, wherein a position of the end of the resin protective film is determined by an end positioning structure comprising a bank, a trench or a combination thereof.

7. The organic EL display apparatus according to claim 6, further comprising an element isolation film for dividing a light-emitting region of the plurality of organic EL elements, wherein the end positioning structure comprises a material for forming the element isolation film.

8. An organic EL display apparatus comprising:
a substrate;
a driving circuit disposed on the substrate;
a planarizing film composed of a resin material and covering the driving circuit;
a plurality of organic EL elements arranged on the planarizing film, each of the organic EL elements including an organic compound layer sandwiched between a first electrode and a second electrode;
a resin protective film covering at least the plurality of organic EL elements; and
an inorganic protective film covering at least the resin protective film,
wherein the planarizing film has a dividing region which divides the planarizing film into a region where the organic EL elements are arranged and a peripheral region thereof;
an end of the resin protective film is located in the dividing region or in the region where the organic EL elements are arranged, away from the planarizing film in the peripheral region; and
the inorganic protective film covers the end of the resin protective film and further extends to the dividing region; and
an inorganic base film is disposed between the second electrode and the resin protective film.

* * * * *